United States Patent [19]

Anderson et al.

[11] Patent Number: 5,390,072
[45] Date of Patent: Feb. 14, 1995

[54] THIN FILM CAPACITORS

[75] Inventors: Wayne A. Anderson, Hamburg; Robert S. Hamilton, Youngstown; Quanxi Jia; Zhiqing Shi, both of Buffalo, all of N.Y.

[73] Assignee: Research Foundation of State University of New York, Albany, N.Y.

[21] Appl. No.: 945,891

[22] Filed: Sep. 17, 1992

[51] Int. Cl.$^6$ .............................................. H01G 4/10
[52] U.S. Cl. .............................. 361/313; 361/321.5; 29/25.42; 427/79
[58] Field of Search ............... 361/312, 313, 321, 322, 361/321.1, 321.5; 501/134, 136, 137; 29/25.42; 427/79, 80; 257/68, 532

[56] References Cited

U.S. PATENT DOCUMENTS

| | | | |
|---|---|---|---|
| 4,437,139 | 3/1984 | Howard | 361/313 |
| 4,734,340 | 3/1988 | Saito et al. | 428/698 |
| 4,803,591 | 2/1989 | Miyashita et al. | 361/321 |
| 4,873,610 | 10/1989 | Shimizu et al. | 361/313 |
| 4,931,897 | 6/1990 | Tsukamoto et al. | 361/313 |
| 5,173,835 | 12/1992 | Cornett et al. | 361/280 |
| 5,192,871 | 3/1993 | Ramakrishnan et al. | 361/277 |

FOREIGN PATENT DOCUMENTS

| | | |
|---|---|---|
| 0046868 | 3/1982 | European Pat. Off. |
| 0442799 | 8/1991 | European Pat. Off. ............. 361/312 |

OTHER PUBLICATIONS

P. J. Harrop & D. S. Campbell Selection of Thin Film Capacitor Dielectrics Apr. 2, 1968.
Yoshihiro Shintani & Osamu Tada Preparation of Thin $BaTiO_3$ Films by dc Diode Sputtering Sep. 9, 1969.
K. Sreenivas & Abhai Mansingh Structural & Electrical Properties of RF-Sputtered Amorphous Barium Titanate Thin Films Jan. 1, 1987.
A. T. Salama & E. Siciunas Characteristics of RF Sputtered Barium Titanate Films on Silicon Jul. 27, 1971.
I. H. Pratt & S. Firestone Fabrication of RF-Sputtered Barium Titanate Thin Films.
Q. X. Jia & W. A. Anderson Sputter Deposition of $YBA_2CU_3O_{7-x}$ Films on SI at 500° C. with Conducting Metallic Oxide as a Buffer Layer Feb. 23, 1990.
T. L. Rose et al Characterization of RF-Sputtered $BaTiO_3$ Thin Films Using A Liquid Electrolyte For the Top Contact Oct. 4, 1983.
Z. Q. Shi et al High-Performance Barium Titanate Capacitors With Double Layer Structure Nov. 1991.
Takao Nagatomo et al Fabrication of $BaTiO_3$ Films by RF Planar-Magnetron Sputtering 1981.

*Primary Examiner*—Bruce A. Reynolds
*Assistant Examiner*—Gregory L. Mills
*Attorney, Agent, or Firm*—Crossetta & Associates

[57] ABSTRACT

The invention relates to a method for forming a high capacitance thin film capacitor comprising forming an amorphous layer of a dielectric material on the surface of a polycrystalline layer of said dielectric material and arranging the resulting double layer between upper and lower electrodes. The invention further comprises dielectric articles such as capacitors formed in accordance with the method of the invention and includes their use in an electronic circuit.

37 Claims, 8 Drawing Sheets

FIG-8

BARIUM TITANATE THIN FILM CAPACITORS

| Layers | Type | Thickness | $\epsilon_r$ | $V_{BD}$ | $\sigma$ | $J(=I/A)$ | $C/A$ |
|---|---|---|---|---|---|---|---|
| P | MIM | 4840 | 330 | $7.2 \times 10^5$ | $9.3 \times 10^{-6}$ | $7.7 \times 10^{-1}$ | $6.0 \times 10^5$ |
| A | MIM | 5000 | 16 | $2.5 \times 10^6$ | $7.7 \times 10^{-11}$ | $6.2 \times 10^{-6}$ | $2.8 \times 10^4$ |
| A/P | MIM | 5050 | 210 | $1.2 \times 10^6$ | $9.1 \times 10^{-11}$ | $7.2 \times 10^{-6}$ | $3.7 \times 10^5$ |
| A/G/P | MIM | 9670 | 130 | $1.8 \times 10^6$ | $8.0 \times 10^{-11}$ | $3.3 \times 10^{-6}$ | $1.2 \times 10^5$ |
| A/G/P | MIM | 4462 | 86 | $1.9 \times 10^6$ | $1.7 \times 10^{-12}$ | $1.6 \times 10^{-7}$ | $1.7 \times 10^5$ |
| A/G/P | MIM | 4190 | 90 | $1.9 \times 10^6$ | $1.3 \times 10^{-7}$ | $1.2 \times 10^{-7}$ | $1.9 \times 10^5$ |
| A/G/P | MIM | 1450 | 66 | $2.1 \times 10^6$ | $9.7 \times 10^{-13}$ | $1.5 \times 10^{-7}$ | $4.0 \times 10^5$ |
| A:H | MIM | 2500 | 25 | — | $1.1 \times 10^{-13}$ | $2.6 \times 10^{-9}$ | $8.9 \times 10^4$ |
| P/SIO$_2$ | MIS | 900 | 16 | $6.0 \times 10^6$ | $2.7 \times 10^{-14}$ | $2.5 \times 10^{-9}$ | $1.3 \times 10^5$ |
| A/RuO$_2$ | MIM | 2460 | 15 | $5.7 \times 10^5$ | $9.8 \times 10^{-14}$ | $1.6 \times 10^{-7}$ | $5.6 \times 10^4$ |
| P/RuO$_2$ | MIM | 2730 | 290 | $3.7 \times 10^5$ | $1.2 \times 10^{-8}$ | $1.7 \times 10^{-3}$ | $9.4 \times 10^5$ |
| A/P/RuO$_2$ | MIM | 2200 | 52 | — | $8.4 \times 10^{-11}$ | $7.6 \times 10^{-6}$ | $2.1 \times 10^5$ |
| P/A/RuO$_2$ | MIM | 1995 | 56 | $1.05 \times 10^6$ | $4.31 \times 10^{-13}$ | $8.4 \times 10^{-8}$ | $2.0 \times 10^5$ |
| A/P/A/RuO$_2$ | MIM | 2280 | 52 | $1.15 \times 10^6$ | $1.0 \times 10^{-13}$ | $1.8 \times 10^{-8}$ | $1.4 \times 10^5$ |

THIN FILM CAPACITORS

The invention relates to thin film dielectric articles and particularly to high performance thin film capacitors having high capacitance per unit area.

BACKGROUND OF THE INVENTION

In forming dielectric articles such as semiconductor integrated circuit devices it is desirable to utilize capacitive elements that have high capacitance in small dimensioned, planar structures to improve the electrical performance and particularly to improve the response of integrated memory circuits. A typical capacitor comprises a pair of electrode layers having dielectric material therebetween. Voltage is applied across the electrode layers and a charge is stored in the capacitor with the amount of charge being storable in the capacitor, e.g. the capacitance, being proportional to the opposing areas of the electrodes and the dielectric constant of the dielectric material. Capacitance has been also found to be inversely proportional to the thickness of the dielectric material, thus thin film capacitors are generally seen as a preferable means to achieve high performance. Problems still exist however, in optimizing the performance of thin film capacitors, so there is a continuing need to improve electrical properties, such as attaining higher dielectric constants, lowering charge dissipation factors and lowering leakage currents.

European Patent 46,868 discloses fabrication of capacitor structures using dielectrics having high dielectric constants and discusses some of the problems associated therewith, particularly the tendency of dielectric materials having a high dielectric constant to degrade rapidly at higher temperatures and their attendant leakage. The European patent proposes to resolve such problem by forming a capacitor structure that includes dual dielectric layers, comprising a first dielectric layer of silicon nitride or aluminum oxide and a second layer selected from a specific group of selected metal oxides and titanates. Such dual layered dielectric capacitors are said to have high capacitance ($\epsilon/t > 0.04$) and satisfactory $E_b$ and dielectric loss.

U.S. Pat. No. 4,734,340 discloses an improved thin film capacitor wherein a particularly thin film dielectric layer, having high dielectric capacitance, is deposited by a sputtering technique and comprises a mixture of tantalum and titanium oxides.

U.S. Pat. No. 4,803,591 discloses an improved capacitor comprising layers of dielectric ceramic compositions of high dielectric constant. The ceramic compositions are characterized as comprising magnesium dioxide together with barium titanate, niobium pentoxide and zinc oxide. The capacitor formed from such ceramic compositions are said to have a high dielectric constant with decreased temperature dependency over a wide temperature range.

U.S. Pat. No. 4,873,610 discloses a dielectric article having a laminate of plural thin film dielectric material layers, comprising a combination of dielectric material layers, that have different temperature characteristics of permittivity. The patent specifies that opposing laminates constitute different dielectric compositions for attaining adjacent layers having different temperature characteristics of permittivity. The reference does not disclosure or infer that layers constituting the same dielectric material can have different temperature characteristics of permittivity.

U.S. Pat. No. 4,931,897 discloses a semiconductor element and method of manufacture wherein a lower electrode, having a polycrystalline silicon film thereon, is treated so that the silicon film comprises an amorphous silicon surface. A thin film of dielectric material is thereafter deposited on the amorphous silicon surface in such manner that the amorphous surface does not recrystallize to a polycrystalline form. The stated objective of the patent is to produce an interface, between the polycrystalline silicon film serving as the lower electrode and the dielectric film, that is flat and uniform to prevent pinholes and electric field concentration. The reference does not disclose the formation of a dielectric film having an amorphous and a polycrystalline layer.

Thus, though the prior art is replete with proposed solutions for manufacture of optimized dielectric articles, such solutions have not sufficiently met the ever increasing demands of the emerging industry for their various uses.

An object of the instant invention is to provide dielectric articles which reduce the leakage problems associated with the use of the various dielectric films.

Another object of the invention is to provide a thin film capacitor that has improved resistance to leakage and has resistance to electric field concentration.

A further object is to provide a method for the formation of thin film dielectric articles that reduces leakage and/or electric field concentration.

A still further object is to provide a thin film capacitor that has improved capacitance per unit film area.

These and other objects of the invention will be apparent from the following recitation.

SUMMARY OF THE INVENTION

The invention comprises a chemically and electronically stable thin film capacitor, having a high dielectric constant and small current leakage, prepared by a method comprising forming a thin, amorphous film layer of a dielectric material on the surface of a thin, polycrystalline film layer of said dielectric material and arranging the double layer between upper and lower electrodes.

In one embodiment a polycrystalline layer of a dielectric is formed on a semiconductor substrate structure that comprises a metal lower electrode, an amorphous layer of a dielectric is formed on the polycrystalline layer and an upper metal electrode is arranged in communication with the amorphous layer.

In another embodiment, an amorphous layer of a dielectric is formed on a semiconductor substrate structure that comprises a metal lower electrode and a polycrystalline layer of a dielectric is deposited on the amorphous layer and has an upper metal electrode in communication therewith. A further amorphous layer of a dielectric may or may not be deposited upon the polycrystalline layer in which instance an upper metal electrode is in communication therewith.

The invention includes dielectric articles such as capacitors formed in accordance with the method of the invention and their use in an electronic circuit. Thus, a capacitor element, formed in accordance with the method of the invention, comprises at least one double layered dielectric component having a polycrystalline layer of the dielectric with a surface thereof comprising an amorphous layer of the dielectric.

Preferably, the polycrystalline layer is formed on a semiconductor substrate structure comprising a metal lower electrode, and a metal upper electrode is arranged in communication with the surface of the amorphous film for completion of a capacitance circuit with the lower electrode.

Suitable semiconductor substrate structures preferably comprise materials such as Si, SiC, GaAs, CdS, ZnO, ZnS or the like. Most preferred is Si, which has been treated or otherwise prepared to receive a film of a suitable dielectric. Typically, the surface of the substrate is prepared before deposition of the dielectric by cleaning and or otherwise treating the substrate to remove impurities, oxides and the like, and/or to create a smoothly refined surface to avoid pinholes from forming upon deposition of the film.

The upper and lower electrode generally comprise a suitably conductive metallic oxide or metal such as aluminum, copper, gold, silver, platinum, palladium, lead, ruthenium and metallic oxides such as $RuO_2$ and the like that form stable electrodes.

Typical dielectric materials which are preferred for use in the invention are those which comprise $BaTiO_3$, $SrTiO_3$, $KNO_3$, $LiNbO_3$, $Bi_4Ti_3O_{12}$, $PbTiO_3$, $PbZrO_3$, $LaTiO_3$, $PbMgO_3$, $PbNbO_3$, $LaZrO_3$ and the like. A most preferred dielectric material useful in the process of the invention is $BaTiO_3$.

Multiple means can be used for forming the dielectric material in a film. Generally, methods useful in depositing the film include rf magnetron sputtering, vacuum evaporation, laser ablation, metal-organic chemical vapor deposition, E-beam evaporation and the like. A most preferred deposition means is rf magnetron sputtering.

In the method of the invention, a polycrystalline film of the selected dielectric is generally formed on a semiconductor substrate comprising the lower electrode, on the electrode itself which has been arranged on the substrate, or, on an amorphous layer which has previously been so formed. It should be understood that the term polycrystalline is meant to include crystalline forms of the dielectric of varying size, shape and crystalline texture. The term amorphous is meant to include quasi-amorphous or nanocrystalline structure, particularly at the boundary of an amorphous layer that has had a polycrystalline layer deposited thereon.

Preferably when the film is formed, the surface of the substrate and/or electrode is treated, prior to formation, to remove undesirable oxides, impurities and the like. When Si is the substrate of choice and the film is being formed on the substrate, it is typically cleaned with trichlorethylene, acetone, methanol and deionized water prior to formation of the polycrystalline film. Native oxide is typically removed from silicon substrates using buffered hydrofluoric acid.

Forming the polycrystalline layer of dielectric material is typically done at elevated temperatures in order to achieve the desired polycrystalline film. For example, when depositing $BaTiO_3$ using rf magnetron sputtering deposition, the deposition is done at temperatures generally in excess of about 540° centigrade with temperatures exceeding about 1,000° centigrade being operable but not generally preferred.

In general, the higher the temperature of polycrystalline film formation the higher the dielectric constant attained. For example, the rf magnetron sputtering deposition of polycrystalline $BaTiO_3$ on a silicon substrate at temperatures of about 700° Centigrade provides a dielectric constant of about 330 while deposition at about 1,000° centigrade attains significantly higher constants, which may exceed 1,000.

Formation of the amorphous layer, is typically carried out at room temperature or at least below a temperature that may cause significant crystallization of the amorphous layer or recrystallization of the polycrystalline layer. Generally it has been found that deposition below about 500° centigrade is adequate to assure that crystallization or recrystallization of the polycrystalline layer does not occur. In general, the lower the formation temperature of the amorphous layer the higher the breakdown voltage and the lower the dielectric constant of that layer.

When forming a polycrystalline layer on an amorphous layer, consideration should be given to modifications that may result at the boundary of an amorphous layer that subsequently receives a high temperature deposit of a polycrystalline layer. Typically, when a polycrystalline layer is deposited at higher temperatures on an amorphous layer, some of the amorphous dielectric is recrystallized forming quasi-amorphous, nanocrystalline or even polycrystalline dielectric. Such does not generally significantly affect capacitance and/or voltage leakage. The amorphous material that is recrystallized can be compensated for by initially providing a thicker amorphous layer.

The thickness of the dielectric film layers can vary but generally the amorphous layer is from about 100 to about 1,000 angstroms thick and the polycrystalline layer is from about 500 to about 10,000 angstroms thick. Preferably, the polycrystalline film is formed in a layer from about 1,500 to about 5,000 angstroms and the amorphous film in a layer from about 100 to about 500 angstroms.

We have found that when the layered structure of the invention is utilized, e.g. wherein an amorphous layer of a dielectric is formed on a polycrystalline layer of the same dielectric, that a synergism occurs which provides more efficient high capacitance performance than otherwise considered achievable through use of a particular dielectric. It is widely known that the polycrystalline form of a dielectric provides a high capacitance, but it is also known that such form is susceptible to low voltage breakdown and concomitant leakage. It is also widely known that the amorphous form of a dielectric has a low capacitance but that such form has a high voltage breakdown and resists leakage.

What we have found, is that when an amorphous layer is formed on a polycrystalline layer forming the structure of the invention, the capacitance and the voltage breakdown level of the resulting double layer is not what would be expected. That is, the operational characteristics of the combined layers do not correspond to their weakest characteristic, nor even correspond to a simple average of the operational characteristics of the two layers. Unexpectedly, we have found that the combined capacitance of the two layers tends to be closer to that of the higher dielectric constant polycrystalline form, while breakdown voltage and concomitant leakage of the combined layers tends to be closer to that of the amorphous layer.

Still further, we have found that a very thin amorphous layer significantly increases the breakdown voltage of the combined layer without also significantly reducing the capacitance of the combined layer.

For example, at elevated formation temperatures of about 700° centigrade, a polycrystalline layer formed having a thickness of about 5,000 angstroms of $BaTiO_3$ was found to have a dielectric constant of about 330. An amorphous film of the same dielectric, having a thickness of about 200 angstroms, which is formed at about room temperature was found to have a dielectric constant of about 16. When an amorphous film is formed on a polycrystalline film, in accordance with the invention, the resulting dielectric constant of the double layer was found to be about 210, while the breakdown voltage exceeded $1 \times 10^6$ V/cm and concomitant leakage were found to be not significantly different from the amorphous layer alone.

Thus, the invention also allows the fabricator to tailor a capacitor to various desirable levels of capacitance at particular breakdown voltages, through comparative film thickness of the dual layers.

These and other objects, features, aspects and advantages of the invention will become more apparent from the following detailed description of the invention when taken in conjunction with the drawings.

BRIEF DESCRIPTION OF THE DRAWINGS

FIG. 8 comprises tabulated data from thin film capacitors comprising amorphous $BaTiO_3$, polycrystalline $BaTiO_3$, polycrystalline-amorphous $BaTiO_3$ and amorphous-polycrystalline-amorphous $BaTiO_3$ layered metal-dielectric-metal and metal-dielectric-semiconductor-metal structures.

DETAILED DESCRIPTION OF THE INVENTION

Figure 1:
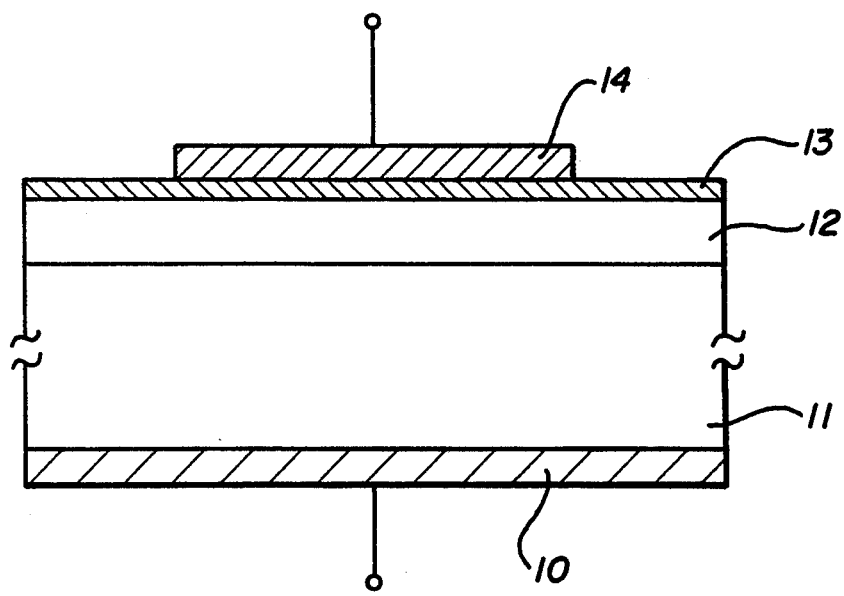
FIG. 1 is a sectional view of a semiconductor capacitive element embodiment having a metal-dielectric-semiconductor-metal structure of the invention.
Figure 1A:
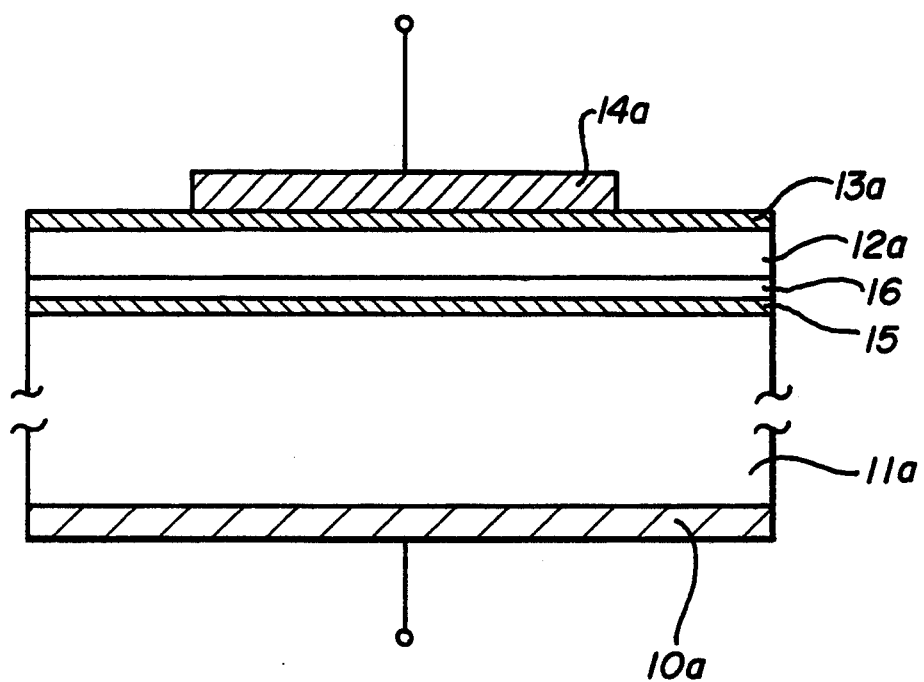
FIG. 1a is a sectional view of another semiconductor capacitive element embodiment having a metal-dielectric-semiconductor-metal structure of the invention.

Referring to the drawings, FIGS. 1 and 1a are sectional views of capacitors of the invention configured wherein the components are arranged in a planer metal-dielectric-semiconductor-metal (ohmic) structure. In FIG. 1, the structure comprises a metal lower electrode 10, engaging semiconductor 11. Semiconductor 11 has formed thereon a double dielectric layer, which comprises a thin film polycrystalline layer 12, formed on semiconductor 11, and a thin film amorphous layer 13 which has been formed on polycrystalline layer 12. Engaging amorphous layer 13 is metal upper electrode 14.

In FIG. 1a, the structure comprises a metal lower electrode 10a, engaging semiconductor 11a. Semiconductor 11a has formed thereon three dielectric layers, which comprises a thin film amorphous layer 15 formed on semiconductor 11a, polycrystalline layer 12a which is formed on amorphous layer 15, and a thin film amorphous layer 13a which has been formed on polycrystalline layer 12a. Engaging amorphous layer 13a is metal upper electrode 14a.

Figure 2:
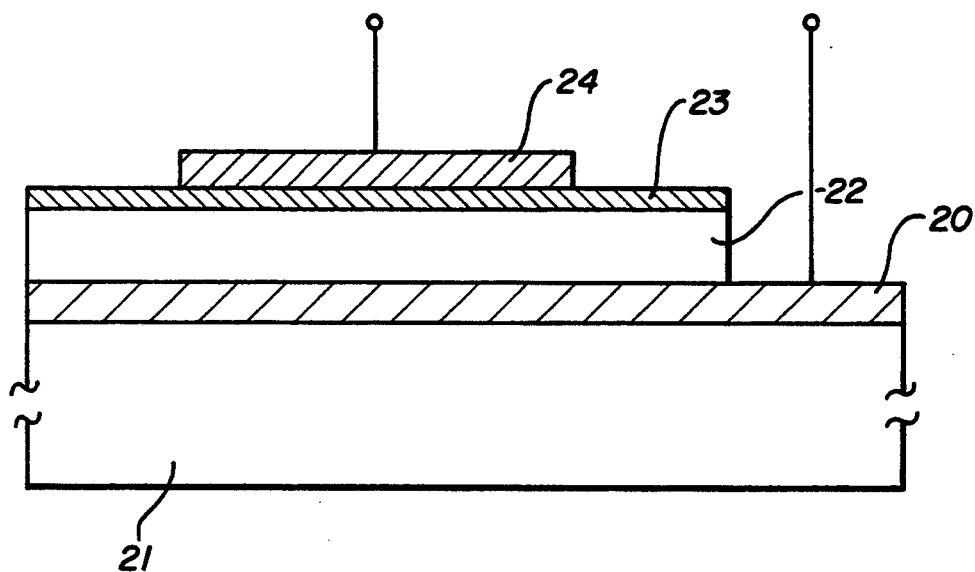
FIG. 2 is a sectional view of a semiconductor capacitive element embodiment having a metal-dielectric-metal structure of the invention.

FIG. 2 is a sectional view of another planer capacitor configuration of the invention wherein the components are arranged in a metal-dielectric-metal structure. Therein, the structure comprises metal lower electrode 20, engaging semiconductor 21. Electrode 20 has formed thereon a dual dielectric layer, which comprises a thin film polycrystalline layer 22, formed on electrode 20, and a thin film amorphous layer 23 which has been formed on polycrystalline layer 22. Engaging amorphous layer 23 is metal upper electrode 24.

In a general embodiment of a thin film capacitor process, a semiconductor substrate, is treated to remove native oxides and cleaned to remove surface impurities. In one embodiment of a metal-dielectric-semiconductor-metal capacitor, a thin film of polycrystalline dielectric is deposited on the upper surface of a silicon substrate, comprising a metal electrode on its opposite surface, by rf magnetron sputtering from a composite dielectric target. The sputtering is done in an argon-/oxygen atmosphere, which may also contain hydrogen, at the crystallization temperature of the dielectric. The polycrystalline film is deposited to a thickness of about 2,000 to about 6,000 angstroms. In an embodiment comprising a metal-dielectric-metal capacitor, the metal electrode is formed on the upper surface of the silicon substrate, it is generally cleaned and the polycrystalline dielectric is deposited as previously described thereon.

A thin film of amorphous dielectric can be deposited on the surface of the polycrystalline film, again using rf magnetron sputtering, but, by maintaining the processing temperature at a temperature below which crystallization can occur. The amorphous film is deposited to a thickness of about 150 to about 300 angstroms. The metal upper electrode is then arranged in engagement with the amorphous layer.

When a polycrystalline layer is deposited on an amorphous layer the amorphous layer can be deposited upon the cleaned semiconductor substrate as before described at a temperature below which crystallization can occur and to a thickness of about 150 to about 300 angstroms. The polycrystalline layer is then deposited on the first amorphous layer at the higher temperatures necessary for crystallization and generally at least some crystallization of the first amorphous layer occurs at about the boundary. The crystallization at about the boundary typically results in quasi-amorphous or nanocrystalline formation in that it comprises a partially crystallized transition from the generally consistent polycrystalline layer to the generally consistent amorphous layer. In an embodiment of the invention, the polycrystalline layer is deposited as a continuation of the deposition of the amorphous layer or vice-versa. In such embodiment, deposition is initiated at a first temperature range, assuring either an amorphous or polycrystalline layer, and at a point of desired film thickness the deposition temperature is gradually changed to cause polycrystalline or amorphous deposition respectively. Such gradual change in temperature results in the formation of a gradient layer, for example at numeral 16 in FIG. 1a, that comprises nanocrystalline or quasi-amorphous dielectric at a desired thickness. Such gradient layer may be desirable when using a dielectric wherein abrupt change in structure is not wanted.

FIGS. 3–8 provide correlation data relating to various embodiments of the invention. In fabricating the capacitors to obtain the data, silicon semiconductor substrates that were used, were treated with buffered hydrofluoric acid to remove native oxides and cleaned with trichlorethylene, acetone, methanol and deionized water, to remove surface impurities prior to formation of the dielectric film. Metal electrodes were also cleaned.

Figure 3:
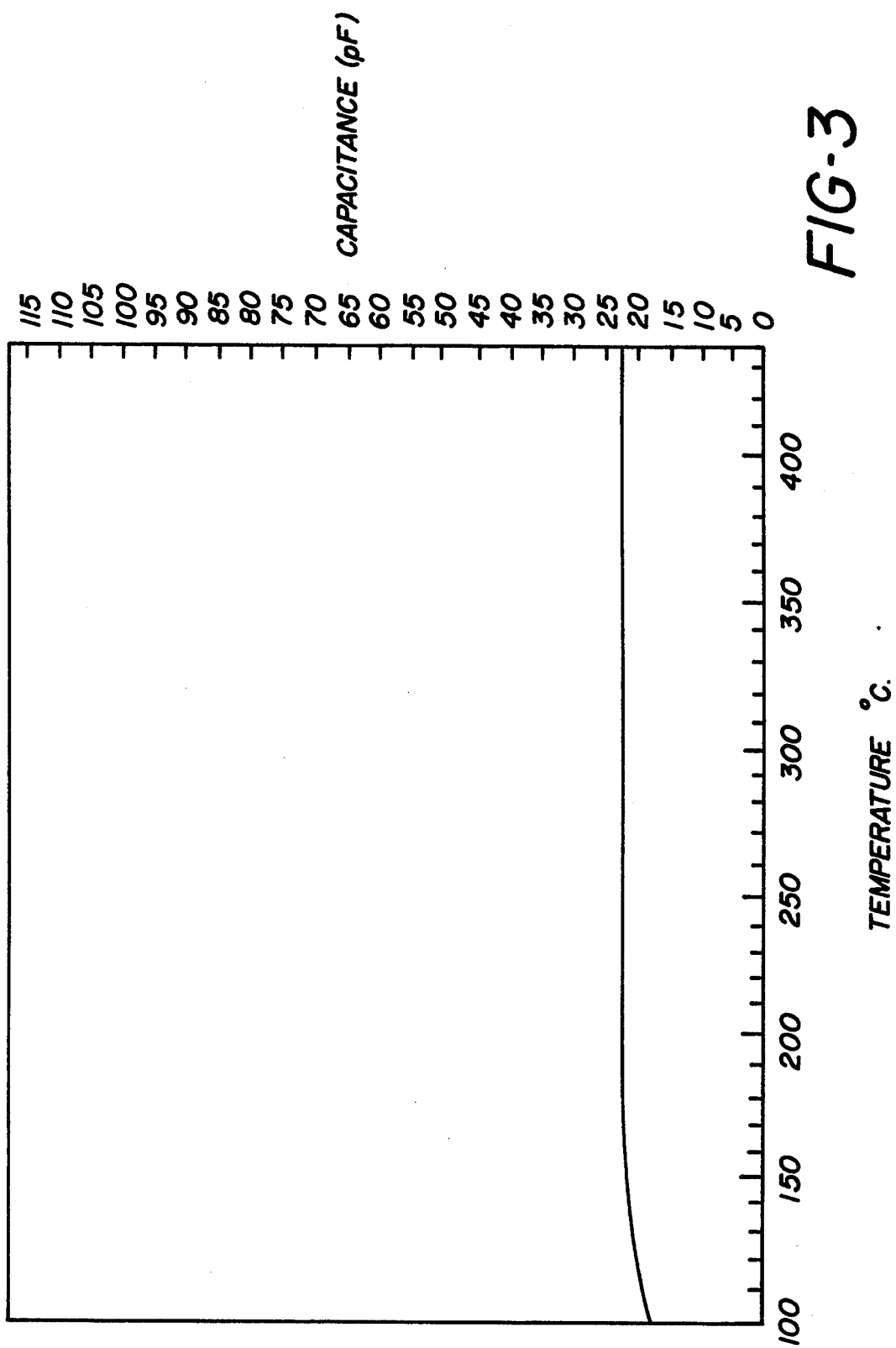
FIG. 3 is a correlation graph, depicting capacitance vs temperature of a thin film of amorphous $BaTiO_3$ formed by rf magnetron sputtering deposition.
Figure 4:
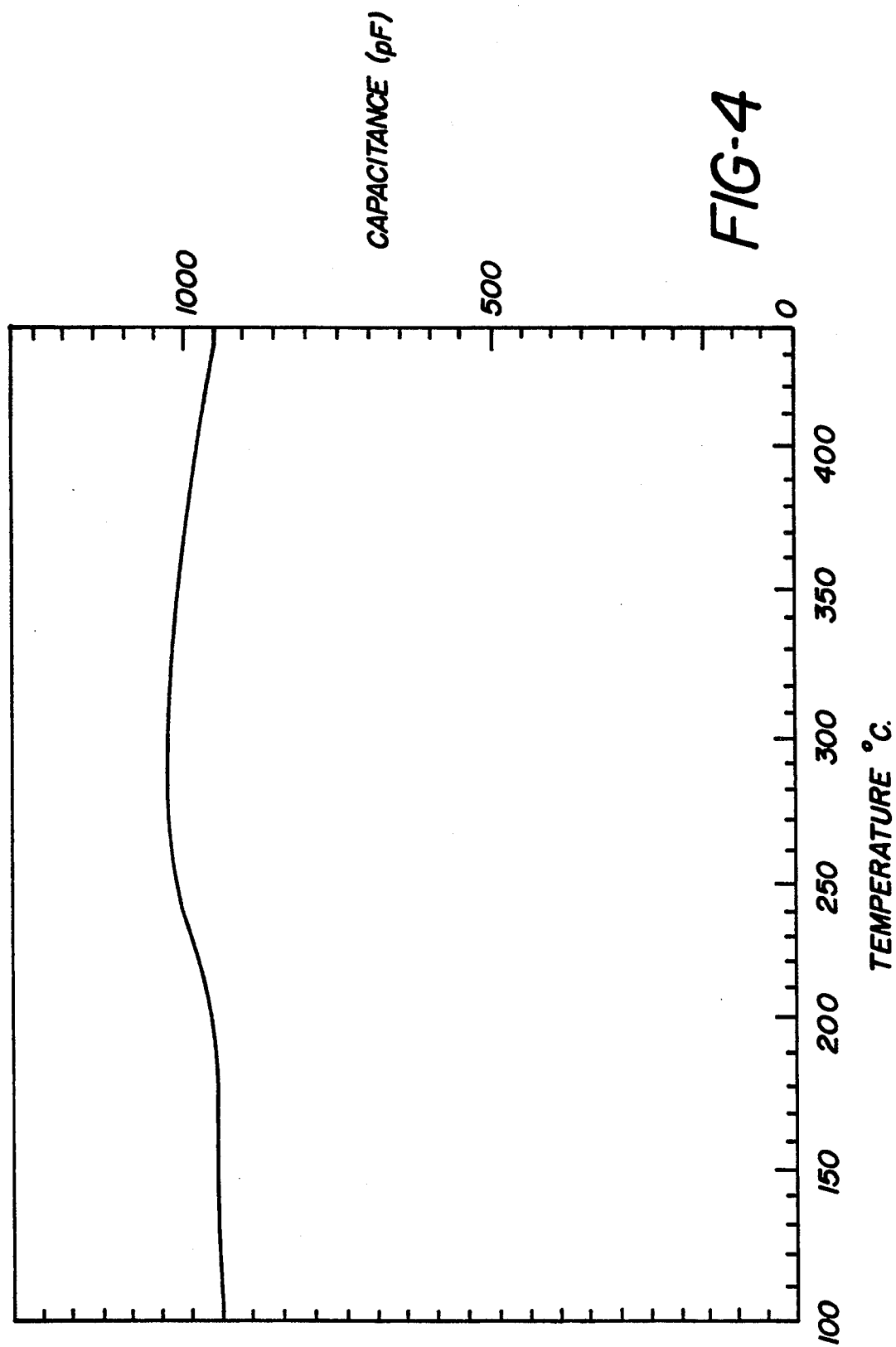
FIG. 4 is a correlation graph, depicting capacitance vs temperature, of a thin film of polycrystalline $BaTiO_3$ formed by rf magnetron sputtering deposition.
Figure 5:
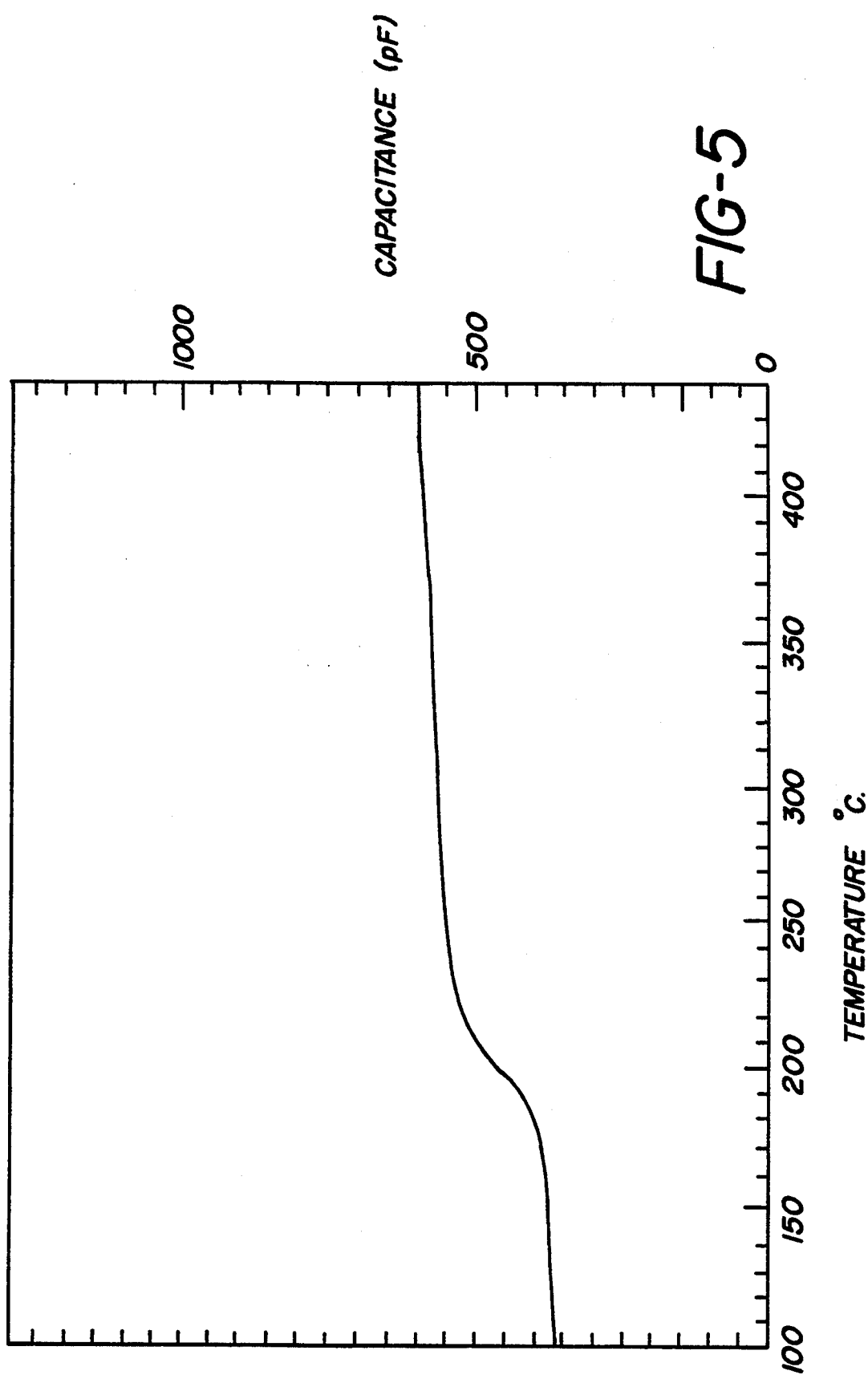
FIG. 5 is a correlation graph, depicting capacitance vs temperature, of a dual thin film containing polycrystalline $BaTiO_3$, layered with a thin film of amorphous $BaTiO_3$, both formed by rf magnetron sputtering deposition.

Metal-dielectric-semiconductor-metal capacitors were fabricated and used to obtain the data for FIGS. 3, 4, 5 and a specifically designated structure of FIG. 8. Metal-dielectric-metal capacitors were fabricated and used to obtain the data for FIGS. 6, 7 and most structures of FIG. 8.

In FIGS. 3–7, for capacitors comprising a film of polycrystalline dielectric, a thin film was deposited on the upper surface of the silicon substrate or metal electrode, by rf magnetron sputtering, from a perpendicularly or parallel arranged composite dielectric target comprising 99.9% pure $BaTiO_3$. The sputtering was at an input power of from 30 to 50 watts, at a total Argon and Oxygen gas pressure of about 20 mTorr and a temperature of from about 540° to about 700° Centigrade. The polycrystalline film was deposited to a thickness of about 5,000 angstroms and the crystalline characteristics thereof were generally confirmed by scanning electron microscopy and X-ray diffraction. Where only a polycrystalline layer was being tested, a metal upper electrode was arranged to engage the polycrystalline film to form the completed capacitor.

In FIGS. 3–7, for capacitors where a double layer was being tested, a thin film of amorphous $BaTiO_3$ was deposited on the surface of the polycrystalline film, again using rf magnetron sputtering, but arranging the composite 99.9% pure $BaTiO_3$ dielectric target parallel to the polycrystalline surface and maintaining the processing temperature at about room temperature in order to avoid recrystallization of the polycrystalline layer. The amorphous film was deposited to a thickness of about 200 angstroms and the amorphous characteristics thereof were generally confirmed by scanning electron microscopy and X-ray diffraction. A metal upper electrode was then arranged to engage the amorphous layer to form the completed capacitor.

In FIGS. 3–7, for capacitors where a single amorphous layer was being tested, a thin film of amorphous dielectric was deposited on the surface of a silicon substrate, or metal lower electrode, by rf magnetron sputtering from a parallel or perpendicular arranged composite dielectric target comprising 99.9% pure $BaTiO_3$. The sputtering was at an input power of from 30 to 50 watts, at a total Argon and Oxygen gas pressure of about 20 mTorr and a temperature maintained at about room temperature. The amorphous film was deposited to a thickness of about 200 angstroms and the amorphous characteristics thereof were generally confirmed by scanning electron microscopy and X-ray diffraction. A metal upper electrode was then arranged to engage with the amorphous layer to form the completed capacitor.

FIG. 3 illustrates the correlation between capacitance and temperature of an amorphous layer of $BaTiO_3$ in a metal-dielectric-semiconductor-metal capacitor. The data demonstrate that though capacitance is maintained essentially constant through the temperature range, it is at a low level, and the breakdown voltage is extremely high at $2.5 \times 10^6$ v/cm.

FIG. 4 illustrates the correlation between capacitance and temperature of a polycrystalline layer of $BaTiO_3$ in a metal-dielectric-semiconductor-metal capacitor. The data demonstrate that though capacitance varies throughout the temperature range, it is maintained at an extremely high level, and breakdown voltage is lower at $7.2 \times 10^5$ v/cm.

FIG. 5 illustrates the correlation between capacitance and temperature of a dual layer comprising polycrystalline $BaTiO_3$ covered by a layer of amorphous $BaTiO_3$ in a metal-dielectric-semiconductor-metal capacitor. The data demonstrate that though capacitance varies throughout the temperature range, it is maintained at a high level, and breakdown voltage is an acceptable $1.2 \times 10^6$ v/cm.

Figure 6:
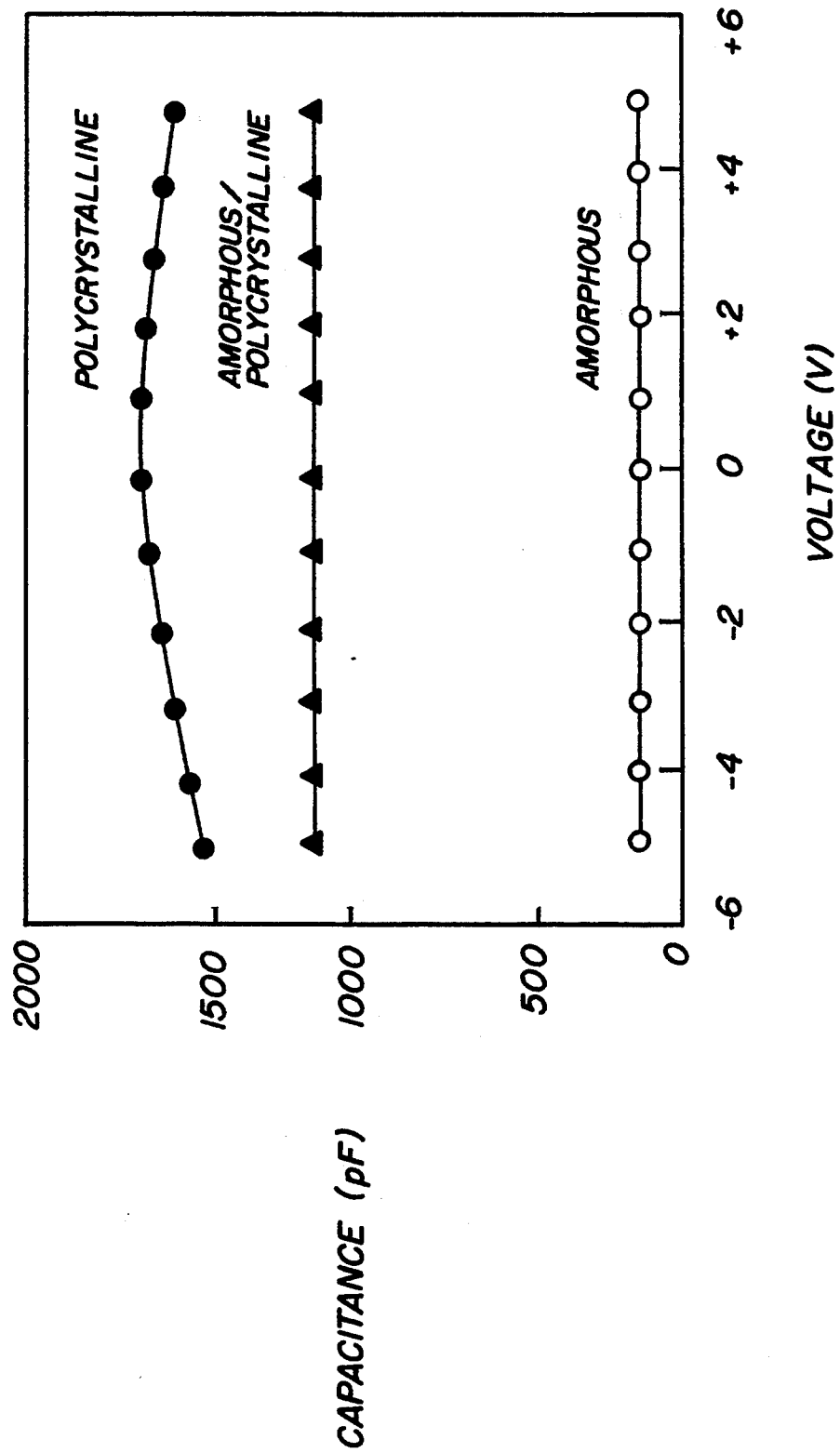
FIG. 6 is a correlation diagram, depicting capacitance vs voltage characteristics, of amorphous $BaTiO_3$, polycrystalline $BaTiO_3$ and dual polycrystalline/amorphous $BaTiO_3$ layered capacitors having a metal-dielectric-metal structure.

FIG. 6 illustrates the correlation between capacitance and voltage characteristics of amorphous, polycrystalline and a dual amorphous/polycrystalline layer metal-dielectric-metal capacitor. The data clearly demonstrate the high capacitance the polycrystalline film as having voltage dependent high capacitance, that is capacitance decreases with increases in voltage. The amorphous and the dual layered species, to the contrary, clearly demonstrate voltage independent characteristics.

Figure 7:
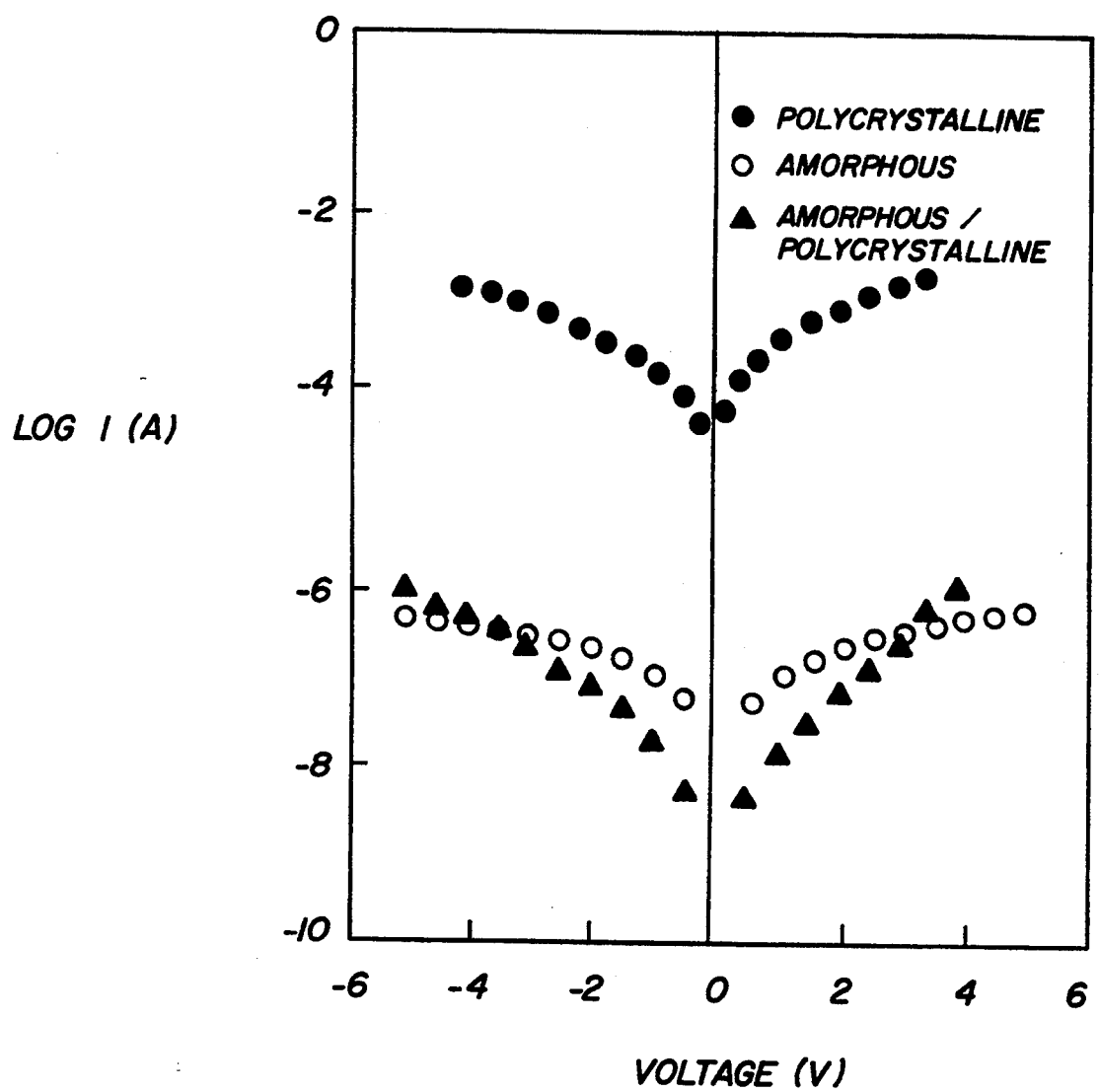
FIG. 7 is a correlation graph, depicting leakage current vs voltage characteristics, of amorphous $BaTiO_3$, polycrystalline $BaTiO_3$ and dual polycrystalline/amorphous $BaTiO_3$ layered capacitors having a metal-dielectric-metal structure.

FIG. 7 illustrates the current-voltage correlation of amorphous, polycrystalline and double amorphous/polycrystalline layer metal-dielectric-metal capacitors. The data clearly demonstrate the double layer as more closely following the desirable response of an amorphous layer than the undesirable response of a polycrystalline layer.

FIG. 8 comprises tabulated data from $BaTiO_3$ dielectric capacitors made with amorphous (A), polycrystalline (P), amorphous-on-polycrystalline (A/P), polycrystalline-on-amorphous (P/A) and amorphous-on-polycrystalline-on-amorphous (A/P/A) layered metal-dielectric-metal (MIM) and metal-dielectric-semiconductor-metal (MIS) type structures. Unless otherwise identified, MIM type structures comprise palladium metal electrodes.

The arrangement of dielectric film layers in a capacitor is tabulated under Layers and the recitation A, P, A/P, P/A and A/P/A is as above identified. Each layer was formed in accord with the processes of FIGS. 3–7. The overall depth of the deposited dielectric film is in angstroms.

Layers reciting A/G/P designate the presence of a gradient layer which was purposely formed, using the processes of FIGS. 3–7, by depositing the dielectric within the high temperature range of above about 540° Centigrade (for polycrystalline formation) and, while continuing deposition, gradually decreasing the temperature to about room temperature (for amorphous formation). A generally consistent polycrystalline layer was deposited at the high temperature range, while, as the temperature gradually lowered below about 520° Centigrade, a gradient layer formed comprising increasing nanocrystalline or quasi-amorphous dielectric which became a generally consistent amorphous deposition as the temperature dropped to room temperature.

Layers reciting A:H designate an amorphous layer deposited in accord with FIGS. 3–7 but using an argon atmosphere containing 5% hydrogen.

Layers reciting $A/RuO_2$, $P/RuO_2$ and $A/P/RuO_2$ had both electrodes made from $RuO_2$ metallic oxide. $P/SiO_2$ layers had a bottom dielectric, 200 angstroms thick made from $SiO_2$, a bottom electrode of Si and an upper electrode made from aluminum. $P/A/RuO_2$ and $A/P/A/RuO_2$ layers had a lower electrode made from $RuO_2$ metallic oxide and an upper electrode made from gold.

Table 1 sets out the thickness of each layer comprising the overall dielectric deposition of layers tabulated in FIG. 8.

In FIG. 8, $\epsilon_r$ is the effective dielectric constant of the dielectric layer(s) relative to air; $V_{BD}$ is the breakdown voltage of the dielectric layer(s) in volts/cm units; $\sigma$ is the conductivity of the dielectric layer(s) in ohms/cm$^{-1}$ units; $J(=I/A)$ is the dc leakage current density at 4 volts in amperes/cm$^2$ units; and C/A is the capacitance per unit area in picofarads/cm$^2$ units.

TABLE 1

| Layers | Thick | A | G | P | A |
|---|---|---|---|---|---|
| P | 4840 | — | — | 4840 | — |
| A | 5000 | 5000 | — | — | — |
| A/P | 5050 | 200 | — | 4850 | — |
| A/G/P | 9670 | 200 | 600 | 8870 | — |
| A/G/P | 4462 | 200 | 600 | 3662 | — |
| A/G/P | 4190 | 100 | 350 | 3640 | — |
| A/G/P | 1450 | 100 | 200 | 1150 | — |
| A:H | 2500 | 2500 | — | — | — |
| P/SiO$_2$ | 900 | — | — | 900 | — |
| A/RuO$_2$ | 2460 | 2460 | — | — | — |
| P/RuO$_2$ | 2730 | — | — | 2730 | — |
| A/P/RuO$_2$ | 2200 | 450 | — | 1750 | — |
| P/A/RuO$_2$ | 1995 | 600 | — | 1395 | — |
| A/P/A/RuO$_2$ | 2280 | 100 | — | 1520 | — |

We claim:

1. A method for preparing a dielectric article comprising forming a dielectric material into first and second film layers arranged in opposing juxtaposition, one of said layers comprising said dielectric material in amorphous configuration, the other of said layers comprising said dielectric material in polycrystalline configuration, and arranging said opposing layers between upper and lower electrodes.

2. The method of claim 1 wherein said dielectric article is arranged in a semiconductor substrate structure.

3. The method of claim 1 wherein said amorphous layer of said dielectric material is formed on a surface of said polycrystalline layer of said dielectric material.

4. The method of claim 1 wherein said polycrystalline layer of said dielectric material is formed on a surface of said amorphous layer of said dielectric material.

5. The method of claim 2 wherein said first layer is formed on said semiconductor substrate structure; said second layer is formed on said first layer; an upper electrode is arranged in electrical communication with said first layer; and a lower electrode is arranged in electrical communication with said semiconductor substrate.

6. The method of claim 2 wherein said first layer is formed on a electrode which is arranged in electrical communication with said semiconductor substrate structure; said second layer is formed on said first layer and an upper electrode is arranged in electrical communication with said second layer.

7. The method of claim 2 wherein said semiconductor substrate structure comprises a material selected from the group consisting of Si, SiC, GaAs, CdS, ZnO and ZnS.

8. The method of claim 1 wherein said dielectric material is selected from the group consisting of $BaTiO_3$, $SrTiO_3$, $KNO_3$, $LiNbO_3$, $Bi_4Ti_3O_{12}$, $PbTiO_3$, $PbZrO_3$, $LaTiO_3$, $PbMgO_3$, $PbNbO_3$ and $LaZrO_3$.

9. The method of claim 1 wherein an electrode comprises a material selected from the group consisting of aluminum, copper, gold, silver, platinum, lead, ruthenium and palladium.

10. The method of claim 1 wherein a dielectric film layer is formed by a method selected from the group consisting of rf magnetron sputtering, vacuum evaporation, laser ablation, metal-organic chemical vapor deposition and E-beam evaporation.

11. The method of claim 10 wherein a film layer is formed by rf magnetron sputtering.

12. The method of claim 1 wherein said polycrystalline film layer is formed at a temperature above about 540° Centigrade.

13. The method of claim 12 wherein said polycrystalline film layer is formed at a temperature from about 540° Centigrade to about 1,000° Centigrade.

14. The method of claim 1 wherein said amorphous film layer is formed at a temperature below about 540° Centigrade.

15. The method of claim 14 wherein said amorphous film is formed at a temperature from about room to about 540° Centigrade.

16. The method of claim 1 wherein said polycrystalline film layer is formed to a thickness of from about 500 to about 10,000 angstroms.

17. The method of claim 16 wherein said polycrystalline film layer is formed to a thickness of from about 1,500 to about 5,000 angstroms.

18. The method of claim 1 wherein said amorphous film layer is formed to a thickness of from about 100 to about 1,000 angstroms.

19. The method of claim 18 wherein said amorphous film layer is formed to a thickness of from about 100 to about 500 angstroms.

20. The method of claim 1 wherein said first and second layers are separated by a gradient layer comprising quasi-amorphous or nanocrystalline configured dielectric material.

21. The method of claim 20 wherein said first and second layers are formed by depositing dielectric material in said first layer under first temperature conditions and depositing said dielectric material in said second layer under second temperature conditions and the gradient layer is formed by changing temperature conditions during deposition of said dielectric material from said first temperature conditions to said second temperature conditions.

22. The method of claim 21 wherein said polycrystalline layer is formed by deposition of a dielectric material at a temperature above about 540° Centigrade, temperature is lowered during deposition so as to deposit a gradient layer on the poly-crystalline layer comprising nanocrystalline or quasi-amorphous dielectric material and thereafter depositing an amorphous layer on the gradient layer.

23. The method of claim 21 wherein said amorphous layer is formed by deposition of a dielectric material at a temperature below about 500° Centigrade, temperature is raised during deposition so as to deposit a gradient layer on the amorphous layer comprising nanocrystalline or quasi-amorphous dielectric material and thereafter depositing a polycrystalline layer on the gradient layer.

24. The method of claim 1 comprising a further amorphous layer in opposing juxtaposition to said polycrystalline layer.

25. A high performance capacitor comprising first and second film layers of a dielectric material arranged in opposing juxtaposition, one said layer comprising said dielectric material in amorphous configuration, the other of said layers comprising said dielectric material in polycrystalline configuration, said opposing layers being arranged between upper and lower electrodes.

26. A capacitor of claim 25 arranged in a semiconductor substrate structure.

27. A capacitor of claim 26 wherein said first layer engages said semiconductor substrate structure; said second layer engages said first layer; an upper electrode is arranged in electrical communication with said first layer; and a lower electrode is arranged in electrical communication with said semiconductor substrate.

28. A capacitor of claim 26 wherein said first layer engages an electrode which is arranged in electrical communication with said semiconductor substrate structure; said second layer engages said first layer and an upper electrode is arranged in electrical communication with said second layer.

29. A capacitor of claim 26 wherein said semiconductor substrate structure comprises a material selected from the group consisting of Si, SiC, GaAs, CdS, ZnO and ZnS.

30. A capacitor of claim 25 wherein said dielectric material is selected from the group consisting of $BaTiO_3$, $SrTiO_3$, $KNO_3$, $LiNbO_3$, $Bi_4Ti_3O_{12}$, $PbTiO_3$, $PbZrO_3$, $LaTiO_3$, $PbMgO_3$, $PbNbO_3$ and $LaZrO_3$.

31. A capacitor of claim 25 wherein an electrode comprises a material selected from the group consisting of aluminum, copper, gold, silver, platinum, lead, ruthenium and palladium.

32. A capacitor of claim 25 wherein said dielectric film layer is formed by a method selected from the group consisting of rf magnetron sputtering, vacuum evaporation, laser ablation, metal-organic chemical vapor deposition and E-beam evaporation.

33. A capacitor of claim 25 wherein said polycrystalline film is from about 500 to about 10,000 angstroms thick.

34. A capacitor of claim 25 wherein said amorphous film is from about 100 to about 1,000 angstroms thick.

35. A capacitor of claim 25 wherein said first and second layers are separated by a gradient layer comprising quasi-amorphous or nanocrystalline configured dielectric material.

36. A capacitor of claim 35 wherein said gradient layer is formed by changing temperature conditions during deposition of the dielectric material.

37. A capacitor of claim 25 comprising a further amorphous layer in opposing juxtaposition to said polycrystalline layer.

* * * * *

UNITED STATES PATENT AND TRADEMARK OFFICE
CERTIFICATE OF CORRECTION

PATENT NO. : 5,390,072

DATED : Feb. 14, 1995

INVENTOR(S) : Wayne A. Anderson, Robert S. Hamilton, Quanxi Jia, Zhiqing Shi

It is certified that error appears in the above-identified patent and that said Letters Patent is hereby corrected as shown below:

Column 12:

Claim 36, line 1, after "said", insert --- first and second layers are formed by deposition of said dielectric material under first and second temperature conditions and said --- line 2, after "changing", insert --- from said first to said second ---

Signed and Sealed this

Twenty-sixth Day of September, 1995

Attest:

BRUCE LEHMAN

*Attesting Officer*  *Commissioner of Patents and Trademarks*